United States Patent
Toshima et al.

(10) Patent No.: US 10,295,409 B2
(45) Date of Patent: May 21, 2019

(54) SUBSTRATE MEASUREMENT SYSTEM, METHOD OF MEASURING SUBSTRATE, AND COMPUTER PROGRAM PRODUCT

(71) Applicant: Toshiba Memory Corporation, Minato-ku (JP)

(72) Inventors: Miki Toshima, Yokohama (JP); Satoshi Usui, Nagoya (JP); Manabu Takakuwa, Tsu (JP); Nobuhiro Komine, Nagoya (JP); Takaki Hashimoto, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 248 days.

(21) Appl. No.: 15/169,902

(22) Filed: Jun. 1, 2016

(65) Prior Publication Data
US 2017/0235232 A1    Aug. 17, 2017

Related U.S. Application Data

(60) Provisional application No. 62/294,070, filed on Feb. 11, 2016.

(51) Int. Cl.
| *G03F 7/20* | (2006.01) |
| *G01J 3/457* | (2006.01) |
| *G01B 11/06* | (2006.01) |
| *G03F 9/00* | (2006.01) |

(52) U.S. Cl.
CPC ............. *G01J 3/457* (2013.01); *G01B 11/06* (2013.01); *G03F 7/70633* (2013.01); *G03F 9/7046* (2013.01); *G03F 9/7084* (2013.01)

(58) Field of Classification Search
CPC ...... G01B 11/06; G01J 3/457; G03F 7/70633; G03F 9/7046; G03F 9/7084
See application file for complete search history.

(56) References Cited

U.S. PATENT DOCUMENTS

| 8,885,173 B2 | 11/2014 | Ohtsuka et al. |
| 2002/0106848 A1* | 8/2002 | Wack ................ G01N 21/211 438/200 |
| 2007/0064233 A1* | 3/2007 | Takagi ................ G03F 9/7049 356/401 |

FOREIGN PATENT DOCUMENTS

| JP | 3-156911 | 7/1991 |
| JP | 7-211613 | 8/1995 |
| JP | WO 2011/045967 A1 | 4/2011 |

* cited by examiner

*Primary Examiner* — Steven Whitesell Gordon
(74) *Attorney, Agent, or Firm* — Oblon, McClelland, Maier & Neustadt, L.L.P.

(57) ABSTRACT

According to one embodiment, a value of a film thickness of a processing object disposed above a substrate is obtained. Then, a wavelength that provides a highest degree of intensity of signal light reflected when the signal light is incident onto the processing object having the value of the film thickness, based on wavelength selection reference information is selected. Then, a first instruction performing an alignment process to the substrate by use of signal light having a wavelength thus selected is generated. The wavelength selection reference information is information that includes a correlation between values of the film thickness of the processing object and degrees of intensity of the signal light, with respect to a plurality of wavelengths.

15 Claims, 8 Drawing Sheets

SUBSTRATE MEASUREMENT SYSTEM, METHOD OF MEASURING SUBSTRATE, AND COMPUTER PROGRAM PRODUCT

CROSS-REFERENCE TO RELATED APPLICATIONS

This application is based upon and claims the benefit of priority from U.S. Provisional Application No. 62/294,070, filed on Feb. 11, 2016; the entire contents of which are incorporated herein by reference.

FIELD

Embodiments described herein relate generally to a substrate measurement system, a method of measuring a substrate, and a computer program product.

BACKGROUND

In recent years, NAND type flash memories having a two-dimensional structure are confronting the limit of scaling. Under the circumstances, there have increased the demands for techniques about three-dimensional structure memories that can realize a larger memory capacity by use of integration based on stacking of layers without depending on scaling. As a three-dimensional structure memory, for example, there has been proposed a NAND type flash memory having a three-dimensional structure in which NAND strings are vertically arranged.

According to three-dimensional structure memories, as the memory capacity is set larger, the number of stacked layers is increased, and the product development becomes more difficult together with this. For example, when memory patterns are formed by use of lithography, the overlay accuracy between upper and lower layers is important. As the number of stacked layers is increased, it becomes more difficult to detect a "mark" for alignment measurement present on a lower layer. The alignment measurement using a mark is categorized into bright field measurement and diffraction light measurement. The bright field measurement is a measuring method of performing evaluation based on a contrast of light intensity obtained by forming an image with reflected light from a mark. The diffraction light measurement is a measuring method of performing evaluation based on a change in diffraction light intensity obtained by scanning a mark with laser light. In order to attain a high contrast or a high degree of diffraction light intensity, the measurement conditions, mark design, and/or film structure need to be optimized. However, a changeover of the mark design or film structure entails a process alteration and so has a significant impact.

DETAILED DESCRIPTION

In general, according to one embodiment, there is provided a computer program product executable by a computer and including a non-transitory computer-readable recording medium, which contains a plurality of commands for measuring a substrate. The plurality of commands cause the computer to execute obtaining a value of a film thickness of a processing object disposed above the substrate, selecting a wavelength that provides a highest degree of intensity of signal light reflected when the signal light is incident onto the processing object having the value of the film thickness, based on wavelength selection reference information, and generating a first instruction performing an alignment process to the substrate by use of signal light having a wavelength thus selected. The wavelength selection reference information is information that includes a correlation between values of the film thickness of the processing object and degrees of intensity of the signal light, with respect to a plurality of wavelengths.

Exemplary embodiments of a substrate measurement system, a method of measuring a substrate, and a computer program product will be explained below in detail with reference to the accompanying drawings. The present invention is not limited to the following embodiments.

Figure 1:
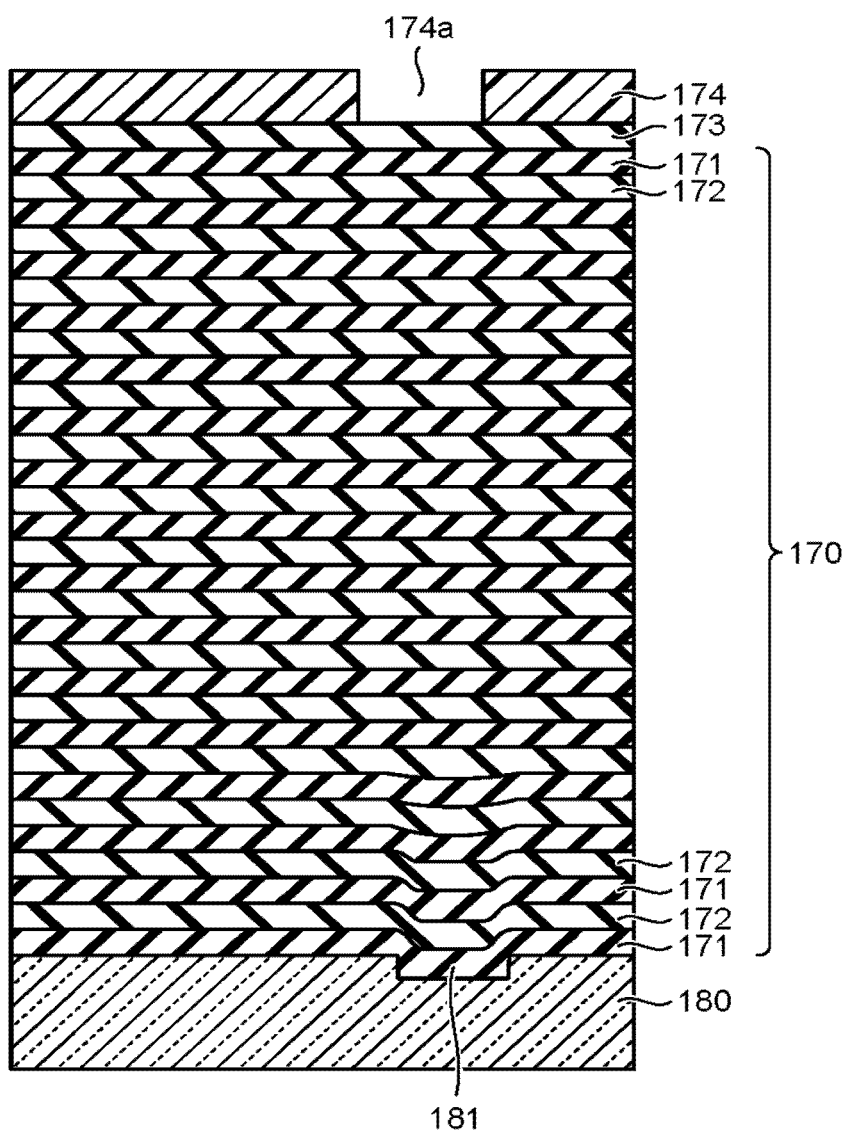
FIG. 1 is a sectional view schematically showing one step of a method of manufacturing a three-dimensional structure memory.

FIG. 1 is a sectional view schematically showing one step of a method of manufacturing a three-dimensional structure memory. As shown in FIG. 1, a spacer film 171 and a sacrificial film 172 are alternately stacked each in a plurality of layers on a wafer 180, so that a layered body 170 is formed. Further, an anti-reflection film 173 is formed on the layered body 170, and then a resist 174 is applied onto the anti-reflection film 173. The wafer 180 may be exemplified by a semiconductor substrate, such as a single crystalline silicon substrate.

Then, patterns for forming memory holes are formed in the resist 174 by use of a lithography technique. Thereafter, by use of the resist 174 serving as a mask, memory holes are formed to penetrate the layered body 170 from the top to the bottom. Thereafter, in each of the memory holes, an inter-electrode insulating film, a charge accumulation film, a tunnel insulating film, and a channel semiconductor film are formed. Then, the sacrificial film 172 in each layer is replaced with an electrode film. As a result of the steps described above, a NAND type flash memory having a three-dimensional structure is manufactured.

In this respect, there is a case that the thickness of the layered body 170 shown in FIG. 1 becomes several μm or more, for example, although it depends on the memory capacity. Accordingly, for example, when positional alignment is performed by use of an alignment mark 181 disposed on the wafer 180 on the lowermost side and an alignment mark disposed on a reticle (not shown), it becomes difficult to detect the alignment mark 181 on the lowermost side. Further, when measurement is performed to the positional deviation between the alignment mark 181 disposed on the wafer 180 on the lowermost side and an alignment mark 174a disposed on the resist 174, it similarly becomes difficult to detect the alignment mark 181 on the lowermost side.

In the following embodiments, an explanation will be given of a substrate measurement system, a method of measuring a substrate, and a computer program product, which can facilitate the detection of an alignment mark disposed on a lower layer even when the positional alignment or positional deviation measurement is performed through a thick processing object.

(First Embodiment)

Figure 2:
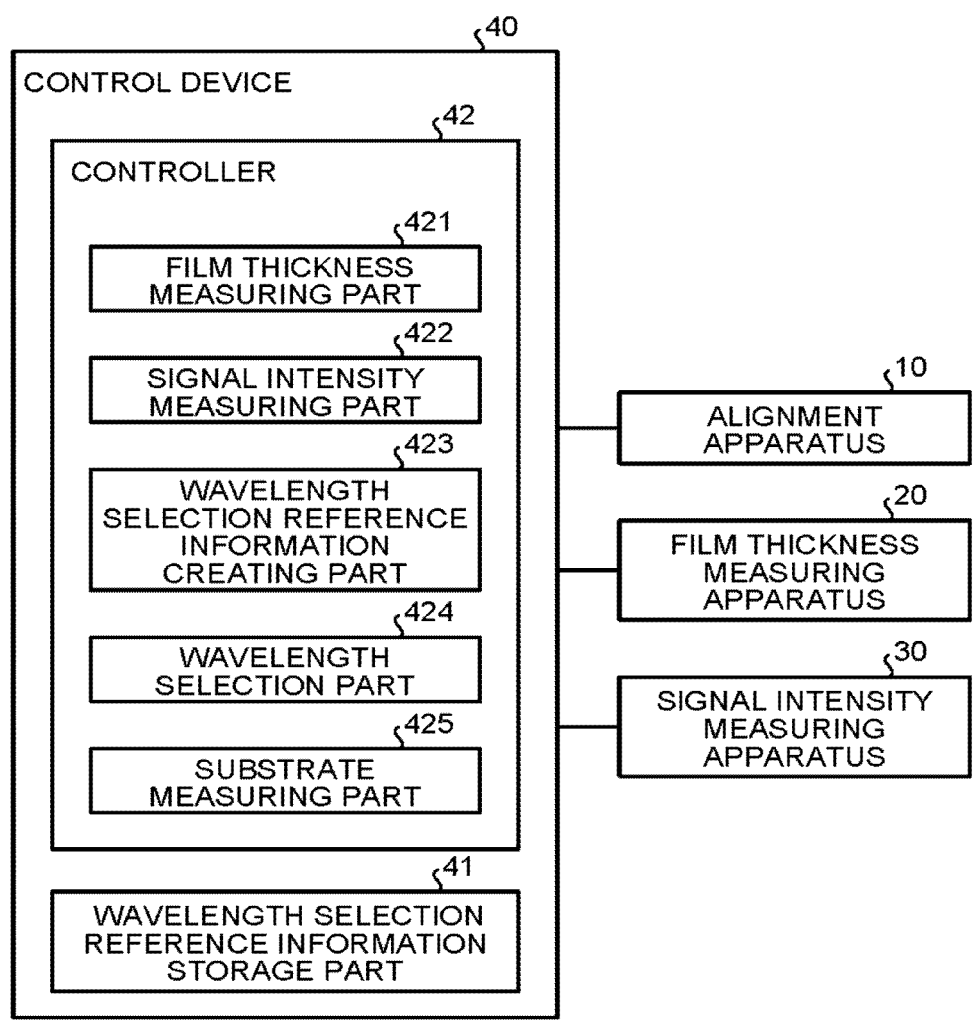
FIG. 2 is a block diagram schematically showing the functional configuration of a substrate measurement system, which includes a substrate measurement system according to a first embodiment.

FIG. 2 is a block diagram schematically showing the functional configuration of a substrate measurement system, which includes a substrate measurement system according to a first embodiment. The substrate measurement system includes an alignment apparatus 10, a film thickness measuring apparatus 20, a signal intensity measuring apparatus 30, and a control device 40.

The alignment apparatus 10 is an apparatus for performing positional alignment to prevent a positional deviation from being generated between a first process performed to a substrate in a first step and a second process subsequently performed to the substrate in a second step. Alternatively, the alignment apparatus 10 is an apparatus for measuring a positional deviation generated on the substrate between the first process and the second process. For example, the alignment apparatus 10 may be exemplified by a light exposure apparatus used for a lithography process, or an overlay measuring apparatus used for an overlay measuring process.

Figure 3:
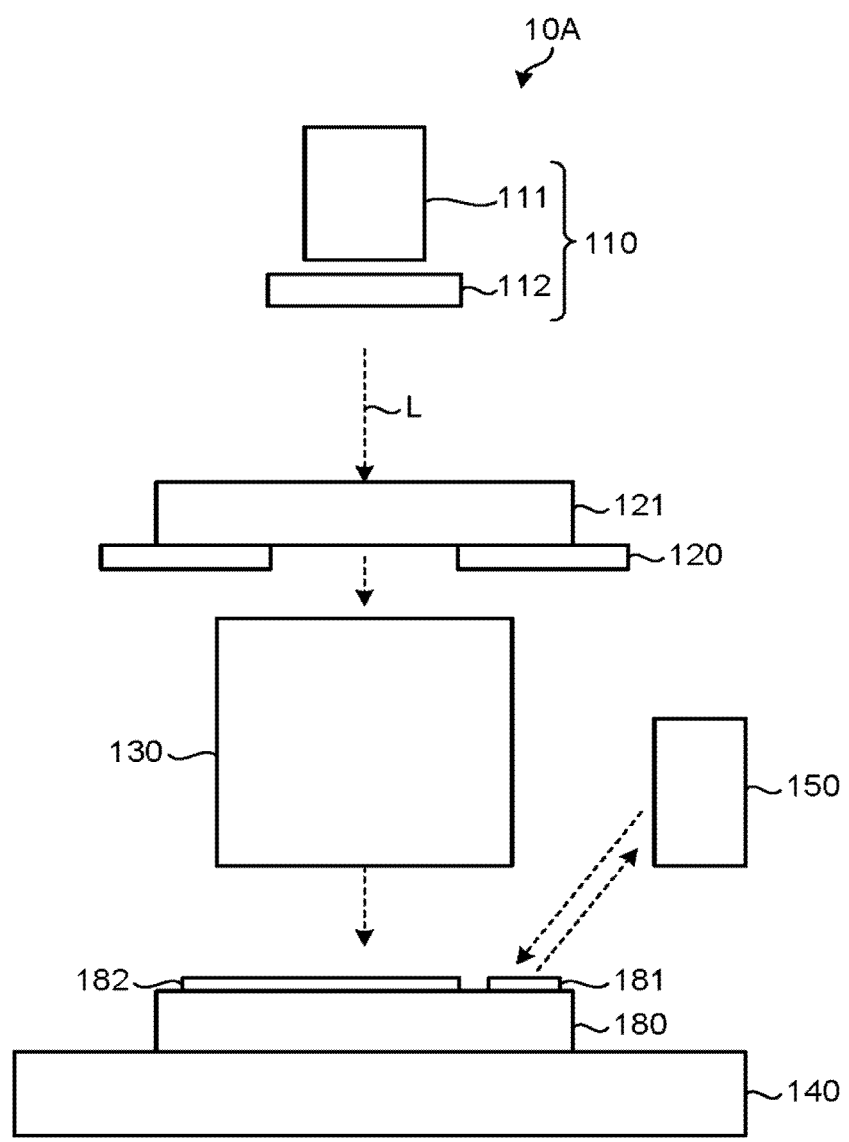
FIG. 3 is a sectional view showing a structural example of a light exposure apparatus.

FIG. 3 is a sectional view showing a structural example of a light exposure apparatus. The light exposure apparatus 10A serving as an alignment apparatus 10 includes an illumination optical system 110, a reticle stage 120, a projection optical system 130, a wafer stage 140, and an alignment measuring unit 150.

The illumination optical system 110 includes an illumination light source 111 and a filter 112. The illumination light source 111 is formed of a white light source configured to emit light having wavelengths within a range of from the infrared region to the visible light region. The filter 112 is configured to transmit light having a predetermined wavelength. The filter 112 is formed of a plurality of filters. These filters 112 are configured to transmit respective kinds of light having different wavelengths. For example, the filters 112 prepared here include a filter for transmitting only light having a first wavelength, a filter for transmitting only light having a second wavelength, a filter for transmitting only light having a third wavelength, and a filter for transmitting only light having a fourth wavelength.

Here, as a non-limiting example, the illumination optical system 110 may include a plurality of illumination light sources 111 without including the filters 112. The plurality of illumination light sources 111 can serve as a monochromatic light source that emits light having different wavelengths within a range of from the infrared region to the visible light region.

The reticle stage 120 is arranged below the illumination optical system 110. The reticle stage 120 is configured to hold a reticle 121 such that it is present in the optical path of light L. Although not shown, the reticle stage 120 is equipped with a mechanism for moving the reticle 121 in a horizontal direction and a mechanism for tilting the reticle 121 relative to the horizontal plane.

The projection optical system 130 is configured to magnify the light L having passed through the reticle 121 and project it. The projection optical system 130 is formed of a refraction type optical system or reflection refraction type optical system, for example.

The wafer stage 140 is configured to hold the wafer 180 at a position where the light L projected by the projection optical system 130 forms an image. The wafer 180 includes an alignment mark 181 and device patterns 182 formed thereon. Although not shown, the wafer stage 140 is equipped with a mechanism for moving the wafer 180 in a horizontal direction and a mechanism for tilting the wafer 180 relative to the horizontal plane.

The alignment measuring unit 150 is configured to detect the alignment mark 181 disposed on the wafer 180, by use of optical means. For example, the alignment measuring unit 150 may be formed of a type utilizing bright field measurement, or a type utilizing diffraction light measurement. In the type utilizing the bright field measurement, evaluation is performed based on a contrast of light intensity obtained by forming an image with reflected light from the alignment mark 181. In the type utilizing the diffraction light measurement, evaluation is performed based on a change in diffraction light intensity obtained by scanning the alignment mark 181 with laser light.

According to this light exposure apparatus 10A, the wafer 180 is placed on the wafer stage 140, and the reticle 121 is placed on the reticle stage 120. Then, positional alignment is performed by use of the alignment mark 181 disposed on the wafer 180 on the lower side and an alignment mark disposed on the reticle 121.

On the other hand, in the case of an overlay measuring apparatus, a positional deviation is obtained according to the bright field measurement or diffraction light measurement, by use of the alignment mark 181 disposed on the wafer 180 on the lower side and the alignment mark 174a disposed on the resist 174 on the upper side.

The film thickness measuring apparatus 20 is an apparatus for measuring the thickness of a film disposed on the wafer 180. As the film thickness measuring apparatus 20, an ellipsometer or Atomic Force Microscope (which will be referred to as "AFM", hereinafter) may be used. When the ellipsometer is used, the film thickness can be measured in a non-destructive manner. However, when the AFM is used, a sectional sample is prepared by cutting the wafer 180 formed with a film, and this sectional sample is observed by use of the AFM to measure the film thickness. The measurement result obtained by the film thickness measuring apparatus 20 is output to the control device 40.

The signal intensity measuring apparatus 30 is configured to measure the intensity of signal light reflected when the signal light is incident onto a film disposed on the wafer 180. This measurement is performed in relation to the wavelength of light transmitted through a filter disposed in the alignment apparatus 10, or the wavelength of light emitted from an illumination light source disposed in the alignment apparatus 10. The measurement result obtained by the signal intensity measuring apparatus 30 is output to the control device 40. Here, if the alignment apparatus 10 is equipped with a signal intensity measuring part, the signal intensity measuring apparatus 30 may be omitted.

Figure 4:
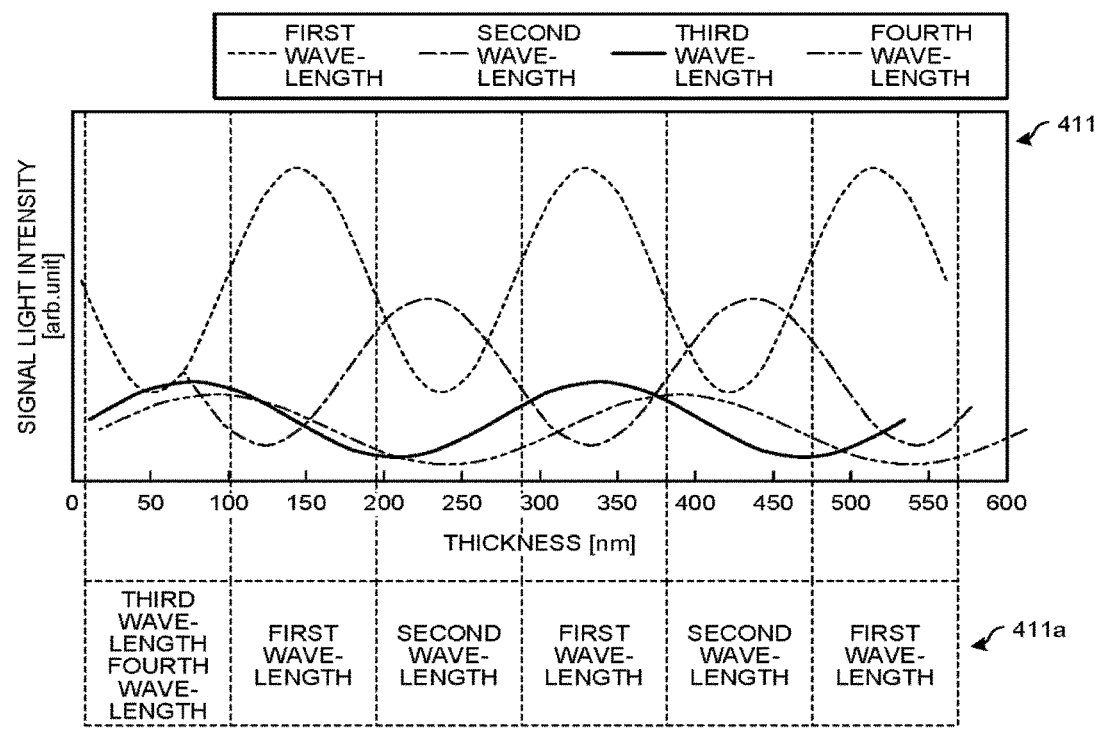
FIG. 4 is a view showing an example of wavelength selection reference information.

The control device 40 includes a wavelength selection reference information storage part 41 and a controller 42. The wavelength selection reference information storage part 41 stores wavelength selection reference information. The wavelength selection reference information is information that shows a change in the reflected signal intensity with respect to a film thickness for each of the wavelengths. FIG. 4 is a view showing an example of the wavelength selection reference information. In FIG. 4, the horizontal axis denotes the film thickness of a processing object (layered body 170), and the vertical axis denotes the intensity of signal light reflected when the signal light is incident onto a mark disposed on the processing object. Here, the wavelength selection reference information 411 is information obtained by such an operation that, after the anti-reflection film 173 and the resist 174 are applied onto the layered body 170 as shown in FIG. 1, light having a predetermined wavelength is radiated from above the resist 174 onto the alignment mark 181 formed at the bottom of the layered body 170, and the intensity of signal light reflected therefrom is measured. For the measurement performed here, the light of the first wavelength, the light of the second wavelength, the light of the third wavelength, and the light of the fourth wavelength are used.

The light radiated onto the layered body 170 is transmitted through the layered body 170, then reflected at the bottom of the layered body 170, and then emitted from the top of the layered body 170. At this time, because of an influence of thin film interference, light reflected on the surface (the upper side of the layered body 170) is intensified or attenuated depending on the film thickness. As regards the light emitted from the layered body 170, the intensifying condition is expressed by the following formula (1), and the attenuating condition is expressed by the following formula (2). Here, "d" denotes the thickness of the layered body 170, "n" denotes the refraction index of the layered body 170, and "λ" denotes the wavelength of light incident onto the layered body 170. Further, it is assumed that "m"=0, 1, 2, - - - .

$$2nd=(m+\tfrac{1}{2})\lambda \quad (1)$$

$$2nd=m\lambda \quad (2)$$

As shown in FIG. 4, the intensity of signal light reflected from the layered body 170 periodically varies together with an increase in the thickness of the layered body 170. For example, the signal light intensity of the light of the first wavelength renders a waveform that has troughs at about 50 nm, about 240 nm, and about 420 nm in the thickness of the layered body 170 and has crests at about 150 nm, about 320 nm, and about 510 nm. The signal light intensity of the light of the second wavelength renders a waveform that has troughs at about 130 nm, about 340 nm, and about 540 nm in the thickness of the layered body 170 and has crests at about 240 nm and about 440 nm. The signal light intensity of the light of the third wavelength renders a waveform that has troughs at about 210 nm and about 470 nm in the thickness of the layered body 170 and has crests at about 80 nm and about 340 nm. The signal light intensity of the light of the fourth wavelength renders a waveform that has troughs at about 250 nm and about 540 nm and has crests at about 100 nm and about 380 nm. In this way, changes in the signal light intensity with respect to values of the thickness of the layered body 170 are captured for the respective wavelengths to form the wavelength selection reference information 411.

It should be noted that, in the explanation described above, the wavelength selection reference information 411 shows changes in the signal light intensity with respect to values of the film thickness of the layered body 170 for the plurality of wavelengths shown in FIG. 4, but the information 411 may be designed to show another feature.

As shown in FIG. 4, when the layered body 170 has a thickness within a range of 0 to 100 nm, the light of the third wavelength or the light of the fourth wavelength tends to be high in the signal light intensity as compared with the other wavelengths. Within a range of 100 nm to 200 nm, the light of the first wavelength tends to be high in the signal light intensity as compared with the other wavelengths. Within a range of 200 nm to 290 nm, the light of the second wavelength tends to be high in the signal light intensity as compared with the other wavelengths. Within a range of 290 nm to 380 nm, the light of the first wavelength tends to be high in the signal light intensity as compared with the other wavelengths. Within a range of 380 nm to 470 nm, the light of the second wavelength tends to be high in the signal light intensity as compared with the other wavelengths. Within a range of 470 nm to 560 nm, the light of the first wavelength tends to be high in the signal light intensity as compared with the other wavelengths.

In consideration of the matters described above, wavelength selection reference information 411a may be designed to record a wavelength that tends to provide a high degree of the signal light intensity as compared with the other wavelengths, with respect to each of the ranges of the thickness of the layered body 170. In this example, since the thickness of the layered body 170 has the ranges of 0 to 100 nm, 100 to 200 nm, 200 to 290 nm, 290 to 380 nm, 380 to 470 nm, and 470 to 560 nm, the kinds of light respectively selected with respect to these ranges are the light of the third wavelength or the light of the fourth wavelength, the light of the first wavelength, the light of the second wavelength, the light of the first wavelength, the light of the second wavelength, and the light of the first wavelength. If this wavelength selection reference information 411a is used, the information amount can be compressed, as compared with the wavelength selection reference information 411.

The controller 42 includes a film thickness measuring part 421, a signal intensity measuring part 422, a wavelength selection reference information creating part 423, a wavelength selection part 424, and a substrate measuring part 425. The film thickness measuring part 421 is configured to control a film thickness measuring process performed in the film thickness measuring apparatus 20. Film thickness measurement is performed to a wafer treated as a measurement object in the alignment apparatus 10, and to a test wafer for creating the wavelength selection reference information. The signal intensity measuring part 422 is configured to control a signal light intensity measuring process for each of the wavelengths, performed to the test wafer. The light used at this time is light having wavelengths the same as those of the monochromatic light source or filters disposed in the alignment apparatus 10.

The wavelength selection reference information creating part 423 can obtain a correlation between values of the film thickness, the measurement wavelengths, and degrees of the signal light intensity from the layered body 170 of test wafers, and create the wavelength selection reference information. Then, the wavelength selection reference information creating part 423 stores the wavelength selection reference information thus created into the wavelength selection reference information storage part 41.

The wavelength selection part 424 is configured to perform selection of light, based on the wavelength selection reference information, such that the light has a wavelength that provides the highest degree of the signal light intensity with respect to the value of the film thickness of the layered body 170 on the wafer 180 received from the film thickness measuring apparatus 20. The wavelength selection part 424 informs the substrate measuring part 425 about the selected wavelength light.

For example, it is assumed that the film thickness of the layered body 170 measured by the film thickness measuring apparatus 20 is 350 nm. As shown in FIG. 4, when the film thickness of the layered body 170 is 350 nm, the signal intensity of the light of the first wavelength is higher than the signal light intensity of the other wavelengths. Accordingly, the wavelength selection part 424 selects the light of the first wavelength.

Alternatively, it is assumed that the film thickness of the layered body 170 measured by the film thickness measuring apparatus 20 is 50 nm. As shown in FIG. 4, when the film thickness of the layered body 170 is 50 nm, the signal intensity of the light of the third wavelength or the light of the fourth wavelength is higher than the signal light intensity of the other wavelengths. Accordingly, the wavelength selection part 424 selects the light of the third wavelength or the light of the fourth wavelength.

The substrate measuring part 425 is configured to control an alignment process in the alignment apparatus 10 by use of the selected wavelength light obtained by the wavelength selection part 424. For example, in the case of the light exposure apparatus 10A shown in FIG. 3, an instruction for performing the alignment process is generated, such that a filter for transmitting the selected wavelength light is selected as the filter 112 of the illumination optical system 110.

Next, an explanation will be given of a process of creating the wavelength selection reference information and an alignment process in the substrate measurement system, in this order.

<Process of Creating Wavelength Selection Reference Information>

Figure 5:
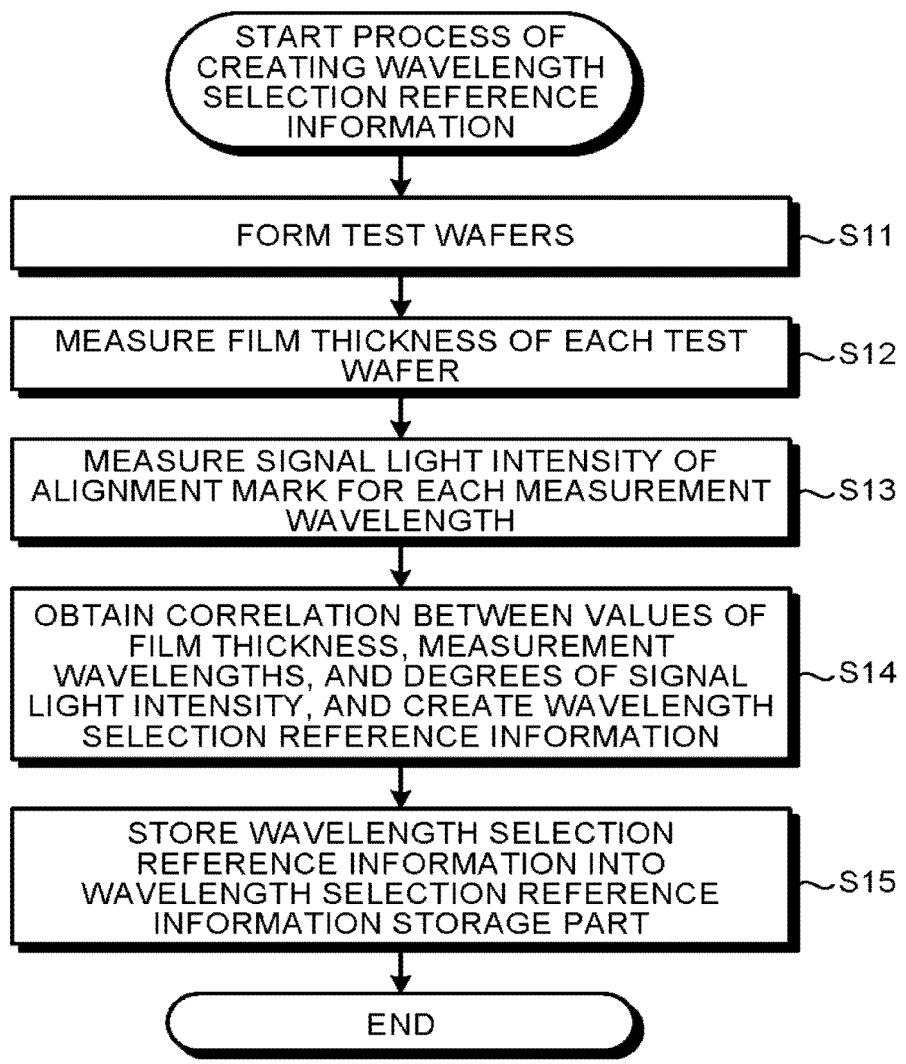
FIG. 5 is a flow chart showing an example of the sequence of a process of creating the wavelength selection reference information according to the first embodiment.

FIG. 5 is a flow chart showing an example of the sequence of a process of creating the wavelength selection reference information according to the first embodiment. At first, test wafers are formed (step S11). For example, each of the test wafers is prepared such that a layered body 170, an anti-reflection film 173, and a resist 174 are stacked in this order on a wafer 180 formed with an alignment mark 181, as shown in FIG. 1. The layered body 170 has a configuration including a plurality of stacked sets, each of which is composed of a spacer film 171 having a first film thickness and a sacrificial film 172 having a second film thickness. For example, the spacer film 171 is formed of a silicon oxide film, and the sacrificial film 172 is formed of a silicon nitride film. Here, a plurality of test wafers different in the film thickness of the layered body 170 are prepared. For example, the film thickness of the layered body 170 can be adjusted by making different the number of sets of the spacer film 171 and the sacrificial film 172.

Then, the controller 42 generates an instruction for measuring the film thickness of a processing object (layered body 170) disposed on the test wafers, and sends it to the film thickness measuring apparatus 20. Consequently, the film thickness of each of the test wafers is measured by the film thickness measuring apparatus 20 (step S12).

Thereafter, the controller 42 generates an instruction for radiating respective kinds of signal light having different wavelengths onto the mark disposed on each of the test wafers and measuring the signal light intensity obtained by reflection, and sends it to the signal intensity measuring apparatus 30. Consequently, the signal light intensity of the alignment mark is measured for each of the measurement wavelengths by the signal intensity measuring apparatus 30 (step S13). By use of each of the types of light respectively having the wavelengths that can be emitted in the alignment apparatus 10, the light is radiated onto the alignment mark through the layered body 170, and its reflected light intensity is measured. This measuring process is performed to all of the test wafers.

Then, the controller 42 obtains a correlation between values of the film thickness, the measurement wavelengths, and degrees of the signal light intensity, and creates the wavelength selection reference information (step S14). For example, a coordinate system is formed such that the horizontal axis denotes the film thickness of the layered body 170 and the vertical axis denotes the signal light intensity, and a plurality of sets of a value of the film thickness and a degree of the signal light intensity for a certain one of the measurement wavelengths are plotted in the coordinate system. Then, an approximate curve is formed to pass through the respective points. This process is performed to all of the measurement wavelengths. As a result, the wavelength selection reference information is obtained as shown in FIG. 4.

Then, the controller 42 stores the wavelength selection reference information thus created into the wavelength selection reference information storage part 41 (step S15), and so the process sequence is completed.

<Alignment Process>

Figure 6:
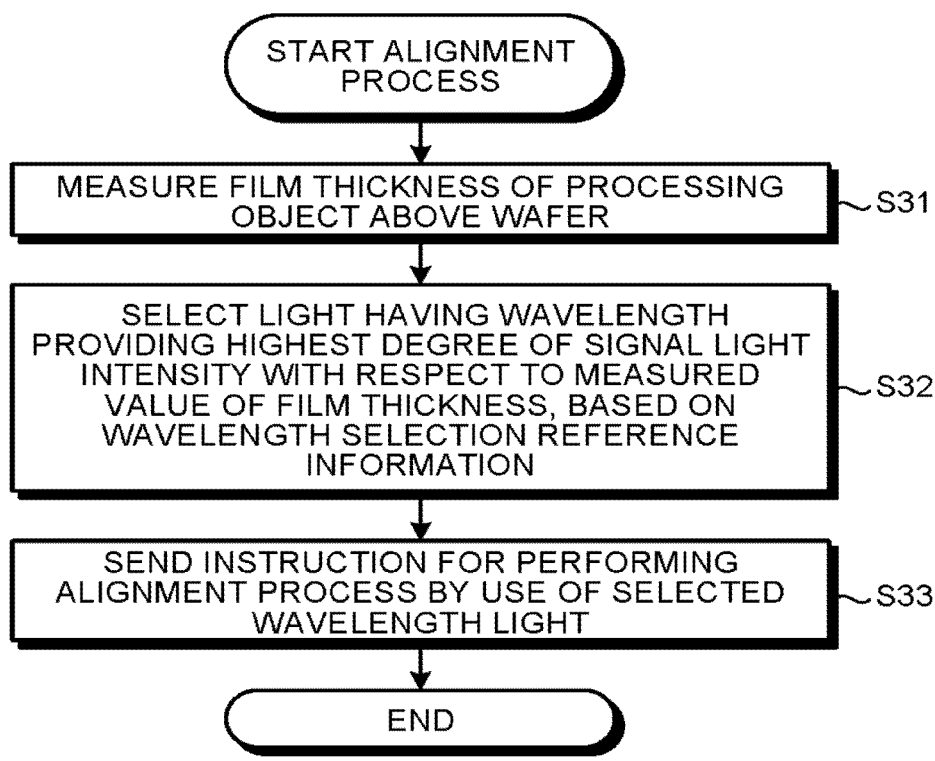
FIG. 6 is a flow chart showing an example of the sequence of an alignment process according to the first embodiment.

FIG. 6 is a flow chart showing an example of the sequence of an alignment process according to the first embodiment. At first, the controller 42 generates an instruction for measuring the film thickness of a processing object above the wafer 180, and sends it to the film thickness measuring apparatus 20. Upon reception of the instruction, the film thickness measuring apparatus 20 measures the film thickness (step S31). In this example, the processing object is the layered body 170. Then, based on the wavelength selection reference information, the controller 42 selects light having a wavelength that provides the highest degree of the signal light intensity with respect to the measured value of the film thickness (step S32).

Thereafter, the controller 42 generates an instruction for performing an alignment process by use of the selected wavelength light, and sends it to the alignment apparatus 10 (step S33). At this time, the wafer 180 is placed in the alignment apparatus 10, and the selected wavelength light is emitted from the illumination light source. As a result, the process sequence is completed.

It should be noted that this alignment process is applied to diffraction light measurement in an alignment step, or applied to overlay measurement or diffraction light measurement in an overlay deviation examination step.

Further, in the explanation described above, when the wavelength selection reference information is created, test wafers different in the film thickness of the layered body 170 are used to obtain degrees of the signal light intensity. However, as some of the data, quality control data obtained in a mass production stage may be utilized. For example, as regards the layered body 170 having a predetermined film thickness, a degree of the signal light intensity measured in the mass production stage may be used.

Here, a comparative example of an alignment process will be explained. According to the comparative example, when the alignment process is performed, light having the same wavelength is used regardless of the value of the film thickness of the layered body 170. For example, in both of the cases that the layered body 170 has a thickness of 300 nm and that it has a thickness of 450 nm, the alignment process is performed by use of the light of the first wavelength, for example. Accordingly, in the case that the film thickness of the layered body 170 is 450 nm, the intensity of the light of the first wavelength is lower as compared with the case with 300 nm, and it may thereby become difficult to perform the detection of a mark disposed on a lower layer.

On the other hand, according to the first embodiment, in relation to an object of the alignment process, the film thickness of the layered body 170 is measured, and light having a wavelength that provides the highest degree of the signal light intensity with respect to the measured value of the film thickness is used to perform the alignment process. Consequently, even if the measurement object has any film thickness, light having the optimum wavelength is selected in accordance with the film thickness, and so a high degree of the signal light intensity can be obtained in the alignment process. As a result, as compared with the comparative example, it is possible to facilitate the detection of a mark disposed on a lower layer.

(Second Embodiment)

In the first embodiment, the wavelength selection reference information is created by measuring test wafers different in the film thickness of the layered body. However, the wavelength selection reference information may be created by performing a simulation.

In this case, the simulation is performed by use of a computer to obtain changes in the intensity of signal light reflected on the layered body 170, with respect to values of the film thickness of the layered body 170, on the premise that the signal light is incident onto the upper surface of a specimen as shown in FIG. 1, for example. This simulation is performed for a plurality of wavelengths of the signal light. Further, this simulation is performed by use of information about the spacer film 171, the sacrificial film 172, the anti-reflection film 173, and the resist 174 in terms of their film thickness, refraction index, and reflectance. Then, the results obtained by this simulation are used as the wavelength selection reference information.

Figure 7:
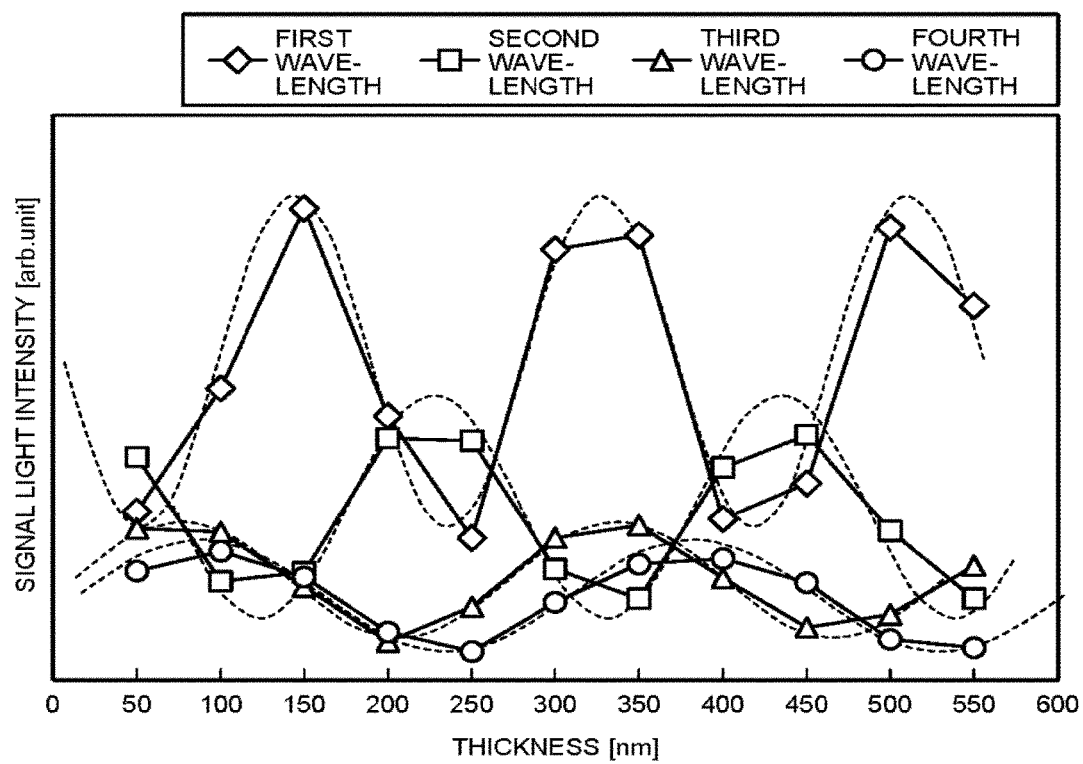
FIG. 7 is a view showing an example of simulation results according to a second embodiment.

FIG. 7 is a view showing an example of simulation results according to the second embodiment. In FIG. 7, the horizontal axis denotes the thickness of the layered body 170, and the vertical axis denotes the intensity of signal light reflected when the signal light is incident onto a mark disposed at the bottom of the layered body 170. As shown in FIG. 7, the signal light intensity with respect to the thickness of the layered body 170 varied at intervals of 50 nm is calculated by use of a computer simulation, for each of the light of the first wavelength, the light of the second wavelength, the light of the third wavelength, and the light of the fourth wavelength. The solid lines are formed by sequentially connecting the simulation result points by straight lines. Further, the broken lines respectively show approximate curves of vibration waveforms passing through the simulation result points. Either of these sets of lines can be selected as the simulation results. If the wavelength selection reference information is satisfied with being approximate, the simulation results shown by the solid lines are used. If the wavelength selection reference information needs to be more exact, the simulation results shown by the broken lines are used.

According to the second embodiment, the wavelength selection reference information is calculated by performing a simulation. In this case, when the wavelength selection reference information is created, there is no need to perform a measuring process using test wafers. As a result, it is possible to reduce the number of test wafers that do not contribute to finished products.

(Third Embodiment)

In the first embodiment, the film thickness of the layered body is measured at one position on the wafer. This is adopted on the premise that the film thickness of the layered body is uniform over the entirety of the wafer. However, in practice, it is rare that the film thickness of the layered body is uniform over the entirety of the wafer. In consideration of this problem, according to the third embodiment, an explanation will be given of a substrate measurement system and a method of measuring a substrate, in the case that the film thickness of the layered body is not uniform over the entirety of the wafer.

A substrate measurement system according to the third embodiment is basically the same as that of the first embodiment shown in FIG. 2. However, in the film thickness measuring apparatus 20, the film thickness measurement is performed to the entire surface of the wafer 180. For example, shot regions are arranged over the wafer 180, and the film thickness measurement is performed to one point in each of the shot regions. Alternatively, film thickness measurement is performed across the entire surface of the wafer 180. The film thickness measurement result is output to the control device 40 together with the position information obtained in the film thickness measurement. The position information may be composed of positions relative to a predetermined reference point on the wafer 180, or may be composed of the positions of the shot regions.

In the control device 40, the wavelength selection part 424 of the controller 42 selects a wavelength of light to be used for each of the shot regions, based on the information received from the film thickness measuring apparatus 20 and the wavelength selection reference information. Here, if values of the film thickness over the entirety of each of the shot regions are received, the film thickness of the layered body 170 in each of the shot regions is defined by the average value of the film thickness of the corresponding shot region, for example.

Further, the substrate measuring part 425 supplies the alignment apparatus 10 with an instruction for performing an alignment process by use of light having a wavelength selected by the wavelength selection part 424 for each of the shot regions. It should be noted that a changeover of the wavelength entails a change of the diffraction pattern in the case of the diffraction light measurement, and that a changeover of the wavelength entails a change of the in-shot coordinates in the case of the bright field measurement. Accordingly, the substrate measuring part 425 applies an offset in consideration of an inter-wavelength difference, so as to compensate for such a deviation caused by a changeover of the wavelength.

For example, if the light of the first wavelength is used as the reference wavelength and the light of the second wavelength is used for the alignment process, there is caused a change of the diffraction pattern or a change of the in-shot coordinates of an alignment mark. Accordingly, in order to prevent a deviation from being caused by a changeover of the light, an offset is applied prior to the alignment process so that a deviation caused by a difference in the wavelength can be cancelled out. For example, in the example of the light exposure apparatus 10A shown in FIG. 3, when positional alignment is performed between the wafer 180 on the wafer stage 140 and the reticle stage 120, an offset is applied to the positional relationship between the alignment mark 181 of the wafer 180 and the alignment mark of the reticle stage 120, in accordance with the wavelength of light used for the positional alignment.

Further, as shown in FIG. 4, the signal light intensity has different degrees depending on the wavelength. For example, the light of the first wavelength has a higher degree of the signal light intensity as compared with light having the other wavelengths. Accordingly, for example, a correction may be applied to the signal light intensity, such that use of the light of the first wavelength in performing the alignment process is set as a reference.

According to the third embodiment, the film thickness is measured for each of the shot regions, and light is selected to have a wavelength suitable for the film thickness in each of the shot regions. In this case, even if the film thickness of the layered body 170 is not uniform over the wafer, it is possible to obtain a high degree of the signal light intensity during the alignment process, and thereby to facilitate the detection of a mark disposed on a lower layer.

Further, when different wavelengths are used for the respective shots, an offset based on an inter-wavelength difference is applied in performing the alignment process. Thus, it is possible to correct a positional deviation of an alignment mark due to a difference in the wavelength.

Figure 8:
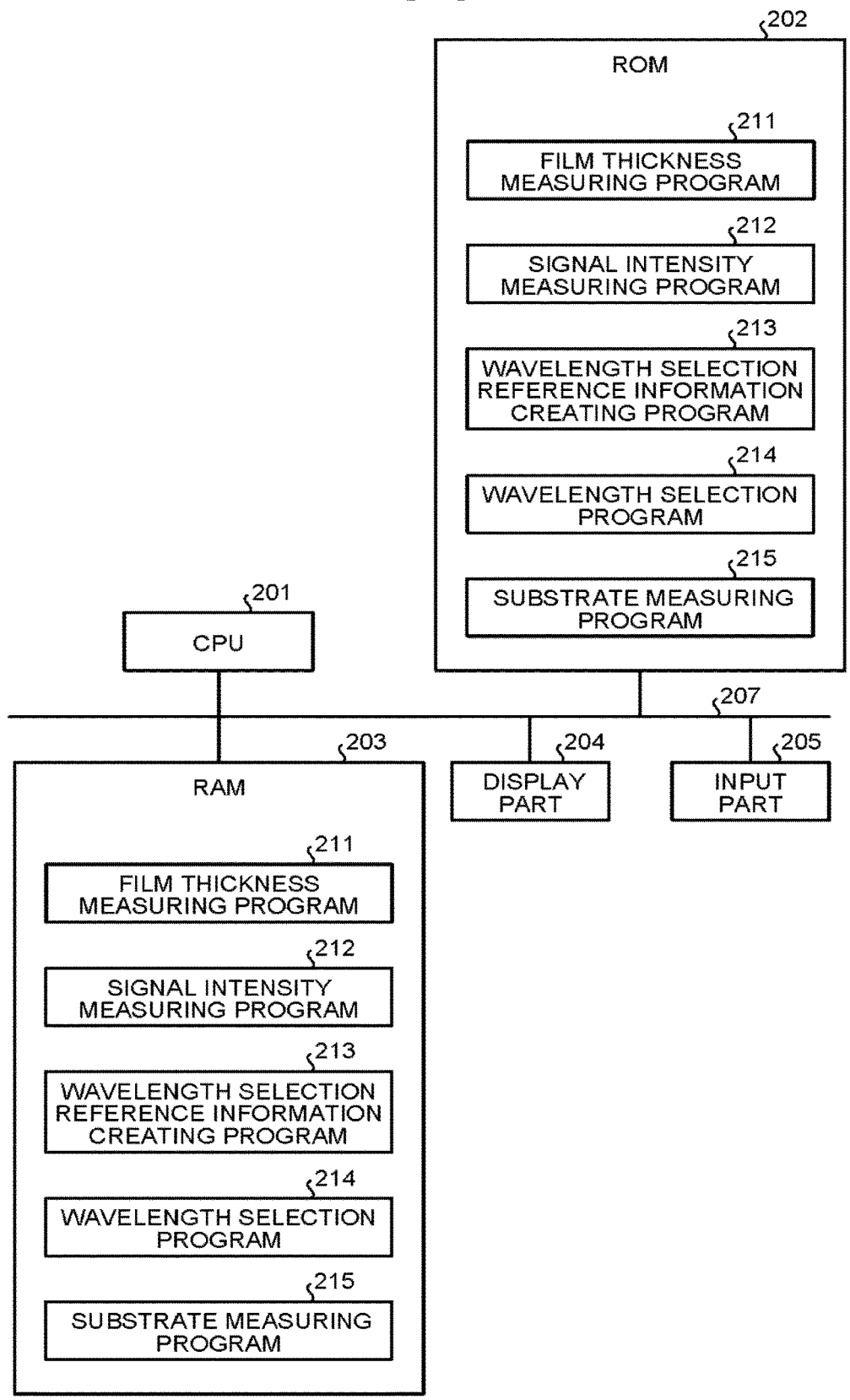
FIG. 8 is a view showing the hardware configuration of a control device.

Next, an explanation will be given of the hardware configuration of the control device 40. FIG. 8 is a view showing the hardware configuration of the control device. The control device 40 includes a CPU (Central Processing Unit) 201, a ROM (Read Only Memory) 202, a RAM (Random Access Memory) 203, a display part 204, and an input part 205. In the control device 40, the CPU 201, the ROM 202, the RAM 203, the display part 204, and the input part 205 are connected to each other via a bus line 207.

The CPU 201 uses a wavelength selection program 214, which is a computer program, to select the wavelength of light to be used in the alignment apparatus 10. Further, the CPU 201 uses a substrate measuring program 215, which is a computer program, to perform the alignment process in the alignment apparatus 10. Further, the CPU 201 uses a wavelength selection reference information creating program 213, which is a computer program, to create the wavelength selection reference information.

The film thickness measuring program 211 is formed of a computer program product executable by a computer and including a recording medium prepared to be readable by a computer and to be non-transitory (non-transitory computer-readable recording medium), which contains a plurality of commands for performing the film thickness measurement in the film thickness measuring apparatus 20. According to the film thickness measuring program 211, the plurality of commands cause the computer to perform the film thickness measurement in the film thickness measuring apparatus 20.

The signal intensity measuring program 212 is formed of a computer program product executable by a computer and including a non-transitory computer-readable recording medium, which contains a plurality of commands for performing the signal intensity measurement in the signal intensity measuring apparatus 30. According to the signal intensity measuring program 212, the plurality of commands cause the computer to perform the signal intensity measurement by use of a plurality of kinds of light having different wavelengths in the signal intensity measuring apparatus 30.

The wavelength selection reference information creating program 213 is formed of a computer program product executable by a computer and including a non-transitory computer-readable recording medium, which contains a plurality of commands for creating the wavelength selection reference information. According to the wavelength selection reference information creating program 213, the plurality of commands cause the computer to perform the process of creating the wavelength selection reference information.

The wavelength selection program 214 is formed of a computer program product executable by a computer and including a non-transitory computer-readable recording medium, which contains a plurality of commands for selecting the wavelength of light to be used in the alignment apparatus 10. According to the wavelength selection program 214, the plurality of commands cause the computer to perform the selection of the wavelength of light to be used in the alignment apparatus 10.

The substrate measuring program 215 is formed of a computer program product executable by a computer and including a non-transitory computer-readable recording medium, which contains a plurality of commands for performing the alignment process in the alignment apparatus 10. According to the substrate measuring program 215, the plurality of commands cause the computer to perform the alignment process in the alignment apparatus 10.

The display part 204 is formed of a display device, such as a liquid crystal monitor, and is configured to display measurement data, the wavelength selection reference information, and so forth, based on instructions from the CPU 201. The input part 205 is formed of a mouse and/or a keyboard, and is used for inputting instruction information (such as commands necessary for the alignment process), which has been externally input by a user. The instruction information input into the input part 205 is sent to the CPU 201.

The film thickness measuring program 211, the signal intensity measuring program 212, the wavelength selection reference information creating program 213, the wavelength selection program 214, and the substrate measuring program 215 are stored in the ROM 202, and can be loaded into the RAM 203 via the bus line 207. FIG. 8 shows a state where the film thickness measuring program 211, the signal intensity measuring program 212, the wavelength selection reference information creating program 213, the wavelength selection program 214, and the substrate measuring program 215 have been loaded into the RAM 203.

The CPU 201 is configured to execute the film thickness measuring program 211, the signal intensity measuring program 212, the wavelength selection reference information creating program 213, the wavelength selection program 214, and the substrate measuring program 215 loaded in the RAM 203. More specifically, according to the control device 40, in response to an instruction input from the input part 205 by a user, the CPU 201 reads the wavelength selection program 214, the substrate measuring program 215, or the wavelength selection reference information creating program 213 out of the ROM 202, and loads it into a program storage region formed inside the RAM 203, to perform various processes. The CPU 201 temporarily stores various data, generated by these various processes, into a data storage region formed inside the RAM 203.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A computer program product executable by a computer and including a non-transitory computer-readable recording medium, which contains a plurality of commands measuring a substrate, wherein the plurality of commands cause the computer to execute generating a first instruction measuring a film thickness of a first processing object disposed above a plurality of test substrates with a first mark;

generating a second instruction measuring intensity of signal light reflected when the signal light is incident onto the first mark via the first processing object above the test substrates, with respect to a plurality of wavelengths;

creating wavelength selection reference information, based on a correlation between values of the film thickness of the first processing object, wavelengths of the signal light, and degrees of intensity of the signal light;

obtaining a value of a film thickness of a second processing object disposed above the substrate with a second mark;

selecting a wavelength that provides a highest degree of intensity of signal light reflected when the signal light is incident onto the second mark via the second processing object having the value of the film thickness, based on the wavelength selection reference information; and generating a third instruction measuring the second mark on the substrate by use of signal light having the wavelength that is selected according to the film thickness of the second processing object, wherein the film thickness of the second processing object is a film thickness at a predetermined position on the substrate.

2. The computer program product according to claim 1, wherein the film thickness of the first processing object includes film thicknesses over an entire surface of the substrate, in the selecting of the wavelength, wavelengths of light in accordance with film thicknesses of the first processing object in shot regions are selected respectively for the shot regions arranged over the substrate, and in the generating of the first instruction, the first instruction to perform an alignment process by use of kinds of signal light having wavelengths thus selected is generated respectively for the shot regions.

3. The computer program product according to claim 2, wherein, in the generating of the first instruction, when light having a second wavelength other than light having a first wavelength serving as a reference is used, an offset in accordance with an inter-wavelength difference between the first wavelength and the second wavelength is applied for the alignment process.

4. The computer program product according to claim 1, wherein in the creating of the wavelength selection reference information, quality control data including a value of the film thickness and a degree of the signal light intensity obtained in a mass production stage of a semiconductor device is utilized.

5. The computer program product according to claim 1, wherein the wavelength selection reference information is calculated by performing a simulation.

6. A substrate measurement system comprising:

a positional alignment apparatus configured to measure a positional relationship between a first mark of a first layer and a second mark of a second layer by radiating signal light onto a substrate;

a film thickness measuring apparatus configured to measure a film thickness;

a control device configured to control positional relationship measurement in the positional alignment apparatus, and film thickness measurement in the film thickness measuring apparatus, and a signal intensity measuring apparatus configured to radiate the signal light onto a test substrate and measure intensity of the signal light reflected, wherein the control device executes sending a first instruction measuring a film thickness of a first processing object disposed above a plurality of test substrates with a third mark, to the film thickness measuring apparatus;

sending a second instruction measuring intensity of signal light reflected when the signal light is radiated onto the third mark via the first processing object above the test substrates, by use of a plurality of different wavelengths of the signal light respectively for the test substrates, to the signal intensity measuring apparatus;

creating the wavelength selection reference information, based on a correlation between values of the film thickness of the first processing object, wavelengths of the signal light, and degrees of intensity of the signal light;

sending a third instruction measuring a film thickness of a second processing object disposed above the substrate with a fourth mark, to the film thickness measuring apparatus;

selecting a wavelength that provides a highest degree of intensity of signal light reflected when the signal light is incident onto the fourth mark via the second processing object having the value of the film thickness measured by the film thickness measuring apparatus, based on wavelength selection reference information; and sending a fourth instruction measuring the fourth mark on the substrate by use of signal light having the wavelength that is selected according to the film thickness of the second processing object, to the positional alignment apparatus, and the film thickness of the second processing object is a film thickness at a predetermined position on the substrate.

7. The substrate measurement system according to claim 6, wherein the first instruction includes a predetermined position on the substrate as a position measuring the film thickness of the first processing object.

8. The substrate measurement system according to claim 6, wherein in the sending of the first instruction to the film thickness measuring apparatus, the control device sends the first instruction to measure film thicknesses of the first processing object over an entire surface of the substrate, in the selecting of the wavelength of the signal light, the control device selects wavelengths in accordance with film thicknesses of the first processing object in shot regions respectively for the shot regions arranged over the substrate, and in the sending of the second instruction to the positional alignment apparatus, the second instruction to perform the positional relationship measurement by use of kinds of signal light having wavelengths thus selected is sent respectively for the shot regions.

9. The substrate measurement system according to claim 8, wherein, in the sending of the second instruction to the positional alignment apparatus, when signal light having a second wavelength other than signal light having a first wavelength serving as a reference is used, an offset in accordance with an inter-wavelength difference between the first wavelength and the second wavelength is applied for the positional relationship measurement.

10. The substrate measurement system according to claim 6, wherein, in the creating of the wavelength selection reference information, the control device utilizes quality control data including a value of the film thickness of the first processing object and a degree of the signal light intensity obtained in a mass production stage of a semiconductor device.

11. The substrate measurement system according to claim 6, wherein the wavelength selection reference information is calculated by performing a simulation.

12. The substrate measurement system according to claim 6, wherein the positional alignment apparatus is formed of an alignment apparatus or overlay deviation examination apparatus.

13. A method of measuring a substrate, the method comprising:

measuring a film thickness of a first processing object disposed above a plurality of test substrates with a first mark;

measuring intensity of signal light reflected when the signal light is radiated onto the first mark via the first processing object above the test substrates, with respect to a plurality of wavelengths;

creating wavelength selection reference information, based on a correlation between values of the film thickness of the first processing object, wavelengths of the signal light, and degrees of intensity of the signal light;

measuring a film thickness of a second processing object disposed above a substrate with a second mark;

selecting a wavelength that provides a highest degree of intensity of signal light reflected when the signal light is incident onto the second mark via the second processing object having the value of the film thickness, based on the wavelength selection reference information; and measuring the second mark on the substrate by use of light having the wavelength that is selected according to the film thickness of the second processing object in a positional alignment apparatus, wherein the film thickness of the second processing object is a film thickness at a predetermined position on the substrate.

14. The method of measuring a substrate according to claim 13, wherein the film thickness of the first processing object includes film thicknesses over an entire surface of the substrate, in the selecting of the wavelength of signal light, wavelengths in accordance with film thicknesses of the first processing object in shot regions are selected respectively for the shot regions arranged over the substrate, and in the measuring of the second mark, the use of kinds of signal light having wavelengths thus selected is performed respectively for the shot regions.

15. The method of measuring a substrate according to claim 14, wherein, in the measuring of the second mark, when signal light having a second wavelength other than signal light having a first wavelength serving as a reference is used, an offset in accordance with an inter-wavelength difference between the first wavelength and the second wavelength is applied to the measuring of the second mark.

* * * * *